United States Patent [19]

Robin et al.

[11] Patent Number: 5,087,816
[45] Date of Patent: Feb. 11, 1992

[54] INFRARED DETECTOR BASED ON PYROELECTRIC MATERIAL

[75] Inventors: Philippe Robin, Bourg La Reine; Dominique Broussoux, Marcoussis; Jean C. Dubois, St. Remy Les Chevreuses, all of France

[73] Assignee: Thomson-CSF, Puteaux, France

[21] Appl. No.: 537,699

[22] Filed: Jun. 14, 1990

[30] Foreign Application Priority Data

Jun. 30, 1989 [FR] France .................. 89 08799

[51] Int. Cl.$^5$ .................................. G01J 5/20
[52] U.S. Cl. ........................ 250/338.3; 250/332
[58] Field of Search ............. 250/338.2, 338.3, 332, 250/349, 333, 338.4

[56] References Cited

U.S. PATENT DOCUMENTS 4,532,424 7/1985 Cheung ................ 250/338.3
4,755,707 7/1988 Nakaya et al. ........... 310/334
4,926,051 5/1990 Turnbull ................ 250/338.3

OTHER PUBLICATIONS

Patent Abstracts of Japan, vol. 12, No. 228, (E627)(3075), Jun. 28, 1988, & JP-A-63 20 868, Jan. 28, 1988, A. Kaneko, "Pyroelectric Infrared Image Sensor".

*Primary Examiner*—Carolyn E. Fields
*Attorney, Agent, or Firm*—Oblon, Spivak, McClelland, Maier & Neustadt

[57] ABSTRACT

An infrared detector based on pyroelectric material, of the type associated with a reading circuit prepared on a semiconductor substrate, the substrate also supporting conductive blocks designed to transmit the electrical signals generated by the pyroelectric material towards the reading circuit. Each conductive block corresponds to a picture element or pixel, wherein the detector is formed by a layer of pyroelectric material deposited on that side of the semiconductor layer having the conductive blocks. The pyroelectric material has a thermal conductivity of K<1 W/m.°K., a counter-electrode covering the layer of pyroelectric material on the side opposite the conductive blocks.

15 Claims, 3 Drawing Sheets

INFRARED DETECTOR BASED ON PYROELECTRIC MATERIAL

BACKGROUND OF THE INVENTION

1. Field of the Invention

The present invention concerns the general field of infrared imaging and, more generally, the field of infrared imaging in ambient temperature.

2. Description of the Prior Art

Infrared imaging works on the following principle: infrared radiation absorbed through a layer of pyroelectric material causes a rise in temperature /T in the layer which itself gives rise to a quantity Q of surface electrical charges, such that:

$$Q = A \cdot P_y \cdot \Delta T$$

where A represents the surface of the layer receiving the radiation and $P_y$ is its pyroelectric coefficient.

As a rule, the relief of the electrical charges induced in a pyroelectric layer by an incident radiation is read by means of an electron beam in a vacuum tube (described in the article by M. BLAMOUTIER, P. CUNIBERTI, P. FELIX and S. VERNON, "Le Pyricon: un tube de prise de vue pour le domaine infrarouge thermique" (The Pyricon: A Pick-Up Tube For The Thermal Infrared Range) in the journal "L'Onde Electric", 1981, vol 61, No. 10, pp. 25 to 28) or by means of a plane matrix of switches associated with charge transfer lines (2D detectors such as those described in GB 2 200 246 and in the article by N. BUTLER, J. McCLELLAND and S. IWASA, "Ambient Temperature Solid-State Pyroelectric IR Imaging Arrays" in SPIE, vol. 930, *Infrared Detectors and Arrays*, 1988, pp. 151 to 163).

This technology of 2D detectors uses hybrid structures that are difficult to make and very costly. The difficulty of making these 2D detectors and their high cost are due to the complexity of these structures. For, instead of using a uniform pyroelectric tube as in the Pyricon tube, 2D detectors have as many pyroelectric elements as there are picture elements or pixels. These pyroelectric elements are moreover placed on electrically conductive but heat-insulating blocks that provide for the electrical connection between the pyroelectric elements and an underlying semiconductor substrate. The small dimensions of the pyroelectric elements (about 200 $\mu \times$ 200 $\mu$) and connecting blocks (having a section of about 50$\mu \times$50$\mu$) makes these structures all the more difficult to build as a large number of pixels is desired.

SUMMARY OF THE INVENTION

In order to overcome these drawbacks, the present invention proposes to replace the pyroelectric elements by a layer of pyroelectric material that meets certain criteria enabling it to be placed directly on the underlying semiconductor substrate. The invention has the advantage of simplifying the design of the detector by making a monolithic structure while at the same time simplifying the technology of its implementation. For, an infrared detector such as this can be made by standard methods used in microelectronics.

An object of the invention, therefore, is an infrared detector based on pyroelectric material, of the type associated with a reading circuit prepared on a semiconductor substrate, said substrate also supporting conductive blocks designed to transmit the electrical signals generated by the pyroelectric material towards the reading circuit, each conductive block corresponding to a picture element or pixel, wherein the detector is formed by a layer of pyroelectric material deposited on that side of the semiconductor layer having the conductive blocks, the pyroelectric material having a thermal conductivity of $K < 1 W/m \cdot K$, a counter-electrode covering said layer of pyroelectric material on the side opposite the conductive blocks.

BRIEF DESCRIPTION OF THE DRAWINGS

The invention will be understood more clearly and other advantages will appear from the following description, given as a non-restrictive example, and from the appended drawings, of which.

DETAILED DESCRIPTION OF THE INVENTION

Figure 1:
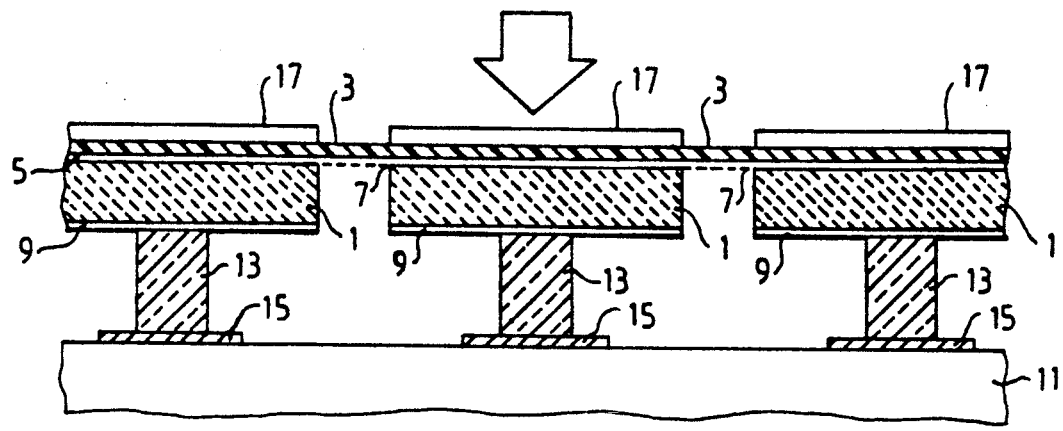
FIG. 1 is a cross-sectional view of an infrared detector according to the prior art.

FIG. 1 shows an infrared detector based on pyroelectric material according to the above-mentioned patent GB 2 200 246. This detector has elements 1 made of pyroelectric material, at a rate of one element per pixel, between a common electrode 5 and elementary electrodes 9. Conductive blocks 13 connect the elementary electrodes 9 electrically to the inputs 15 of processing circuits prepared on the semiconductor substrate 11. A layer 3, having a low thermal conductivity, is placed on top of the common electrode 5 and, on the internal side, it supports conductive tracks providing the electrical continuity among the different parts of the common electrode 5. On the external side, the layer 3 supports parts 17 that absorb the radiation intended for the pyroelectric elements 1 which is indicated by the arrow.

FIG. 1 shows only three pixels but the detector may have many more of them. The very small size of these pixels, and the way in which the different parts of the detector are assembled together, will give an idea of the difficulty of building such a structure.

The pyroelectric material constituting the elements 1 is chosen from among a group of materials with high thermal conductivity ($K > 1$ W/m·K) such as:

lithium tantalate $LiTaO_3$ for which $K = 4.2$ W/m·K,
lead zirconate PZT for which $K = 1.7$ W/m·K,
lead titanate $PbTiO_3$ for which $K = 3.2$ W/m·K,
barium and strontium niobate $SrBaNb_2O_6$ for which $K = 3.8$ W/m·K.

In such materials, the heat energy absorbed on the surface gets propagated very quickly through the thickness. If the pyroelectric elements 1 were to be placed directly on the substrate 11, the heat energy would get dissipated quickly by a conduction effect in the substrate. If this substrate is a good heat conductor like silicon (for which $K = 140$ W/m·K), the effect is further amplified. Consequently, it is necessary to heat insulate the pyroelectric elements of the substrate which behaves like a heat well. This implies the use of the hybrid technology based on blocks that are good conductors of electricity but are heat insulators.

According to the invention, and to overcome the drawbacks of the prior art, a layer of pyroelectric material is deposited on the semiconductor substrate on which the processing circuits, containing the 2D matrix of reading switches and the charge transfer lines, have been made beforehand. This layer may be deposited by using centrifugation for polymers and silk-screen printing for composite materials.

According to the invention, pyroelectric materials of low thermal conductivity (K<1W/m·K) are chosen. It is possible to use polymers (for which K is generally smaller than 0.2 W/m·K) such as:
polyvinylidene fluoride (PVDF),
polyvinylidene fluoride trifluoroethylene (PVDF-TrFE),
polyvinylidene cyanide vinylacetate (PVDCN-VAc)
polyvinylidene cyanide vinylidene fluoride (PVDCN - VDF).

It is also possible to use composite materials (for which K<1 W/m·K) such as compounds of mineral fillers with high thermal conductivity mixed in a polymer matrix with a low thermal conductivity. For example, 60% by weight of PZT in polyimide gives a coefficient K of about 0.9 W/m·K.

Figure 2:
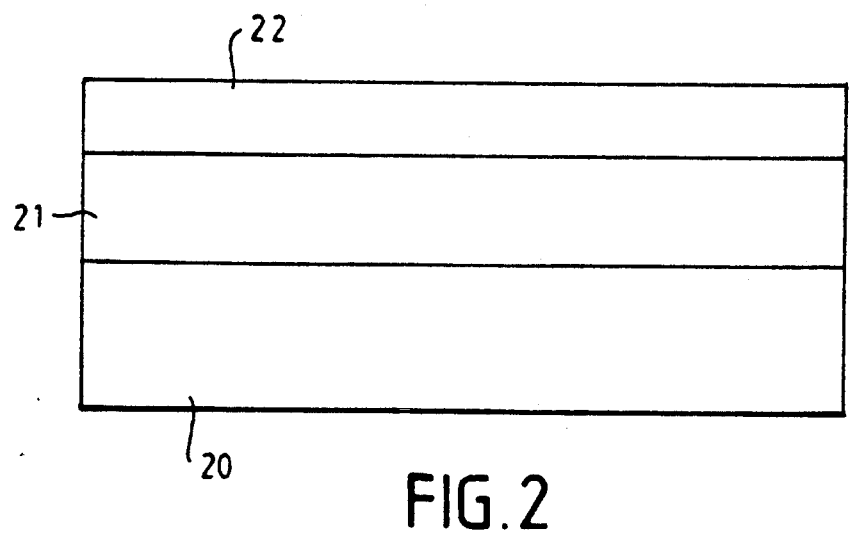
FIG. 2 is a schematic view of the infrared detector according to the invention.

After the layer of pyroelectric material has been deposited, the upper face of this layer is metallized. Then, to bias this layer, a voltage will be applied, making it possible to obtain an electrical field of about 1 MV/cm, i.e. 1000 volts for a 10 $\mu$ thickness of a layer of pyroelectric material. An infrared absorbing material is then deposited on the metallized pyroelectric layer. The structure obtained then has the form shown schematically in FIG. 2: a layer 21 of pyroelectric material lying on the semiconductor substrate and covered with a layer 22 of infrared absorbing material.

The infrared absorbing layer may be made either by evaporation of metal blacks (gold, aluminium or silver) or absorbent metals such as a nickel-chromium alloy, or by deposition by centrifuging a solution containing polymer that is absorbent in the 3 $\mu$–14 $\mu$ wavelength range.

Compared with the prior art, the structure according to the invention is far simpler for it has no heat insulating and electrically conductive blocks which were used to heat insulate the detecting layer of the substrate and collect the electrical charges corresponding to the heat information received.

The fact of using materials with thermal conductivity D<1W/m·K makes it possible to do away with the need for these blocks and for allows depositing the pyroelectric material directly on the reading circuit. Furthermore, it is possible to use pyroelectric material thicknesses of more than 10 $\mu$ without adversely affecting the spatial resolution and, consequently, it is not necessary to-reticulate the detecting layer into isolated pixels as is usually done in the prior art.

Two examples of fabrication shall now be described. The first example concerns the case that flows directly from the invention where the pyroelectric polymer is deposited directly on the reading circuit. The second example concerns limit cases where it is desired all the same to deposit a layer of heat insulator between the pyroelectric polymer and the reading circuit.

FIRST EXAMPLE OF FABRICATION

The reading circuit (CCD, field-effect transistor etc.) has been made beforehand on a silicon substrate, according t the usual techniques known to those skilled in the art. The thickness of this substrate is, for example, between 0.5 and 1 mm.

Figure 5:
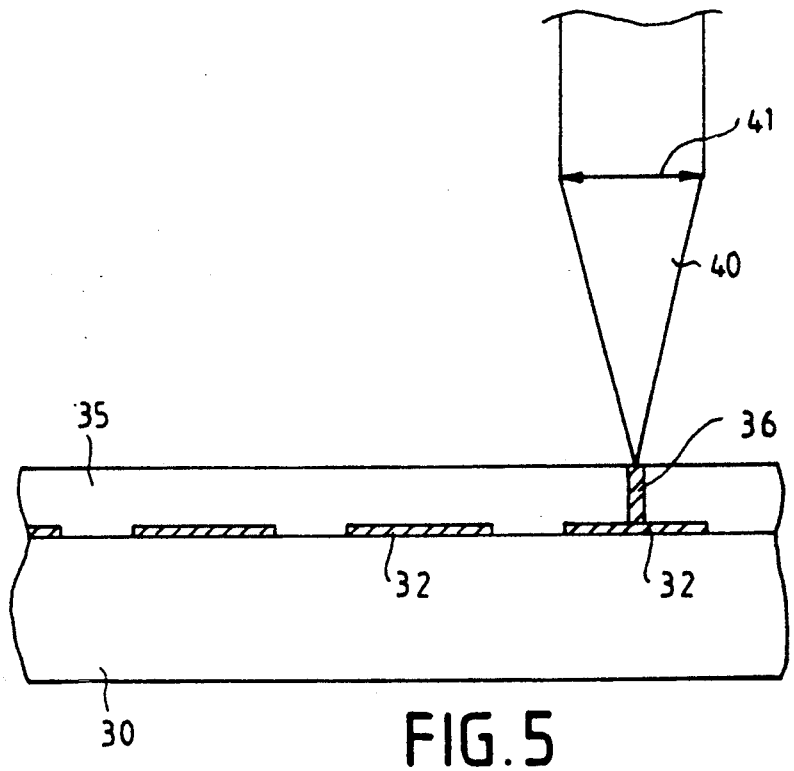
FIGS. 5 to 7 show reading circuits undergoing processing before they receive the infrared detector according to the invention.

FIG. 5 shows a view in perspective of a substrate such as this, referenced 30 and having, on its upper part, a set of electrodes in the form of conductive blocks 32. These blocks are distributed evenly on the surface of the substrate 30 and correspond to as many pixels as are desired. They may be distributed so as to form a matrix arrangement. The blocks 32 may be 250 $\mu$ square, and may be separated from one another by 10 $\mu$. They may be obtained by evaporation of metal in a thickness of 1000 angstroms.

Figure 4:
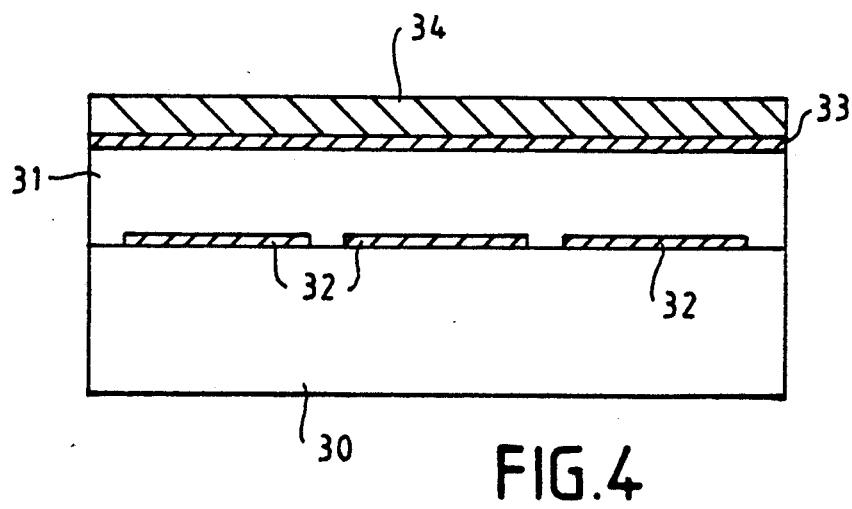
FIG. 4 shows an infrared detector according to the invention, associated with its reading circuit.

A layer 31 of pyroelectric material meeting the conditions of the invention is then deposited on the upper face of the substrate 30 (see FIG. 4). The deposition may be done by centrifugation of a solution of polymer in a solvent: for example, a PVDF-TrFE 75/25 (75% in PVDF moles and 25% in TrFE moles) copolymer in dimethylformamide (DMF). This method of deposition is usually called the "spin-coating method". Several layers of pyroelectric polymer may be deposited to obtain a thickness of between 5 $\mu$ and 60 $\mu$, for example 30 $\mu$.

On the layer 31, a continuous electrode 33 is then deposited to form a counter-electrode, for example in the form of a layer of aluminium with a thickness of 1000 angstroms, by evaporation under vacuum.

The polymer layer 31 may then be biased. The biasing can be done by grounding all the electrodes of the reading circuit and, more particularly, all the conductive blocks of the reading circuit, and by applying a +V voltage to the continuous electrode 33 (for example, V=3000 volts if the polymer thickness is equal to 30 $\mu$).

An infrared absorbing layer 34 is then deposited, for example aluminium black by evaporation of aluminium under a nitrogen atmosphere according to a known technique. The detector is then ready to work.

The infrared absorbing material may be deposited before the biasing operation. The biasing can also be done before the deposition of the continuous electrode 33. The biasing can then be done by Corona effect.

SECOND EXAMPLE OF FABRICATION

Figure 3:
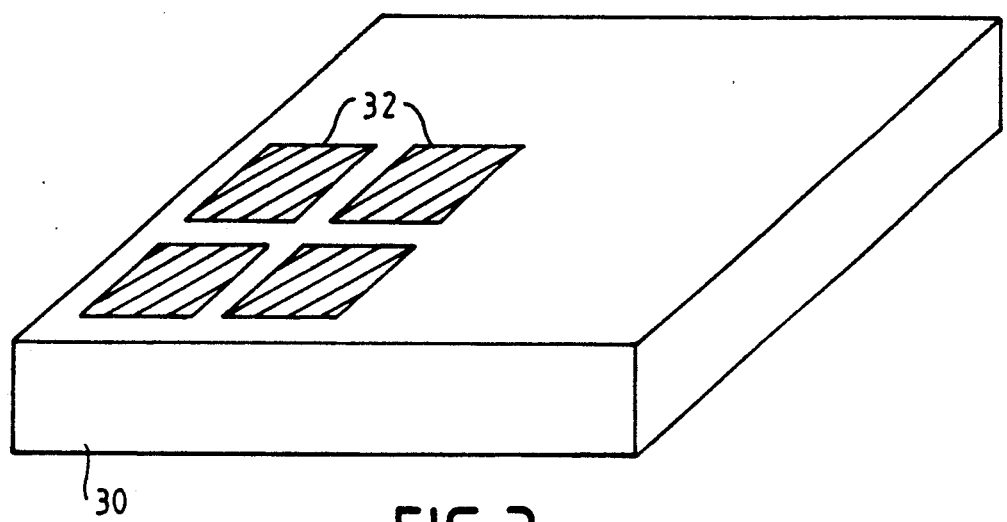
FIG. 3 is a view in perspective of a reading circuit associated with the detector according to the invention.

The substrate used is the one shown in FIG. 3. A layer 35 of heat insulator is deposited on the substrate 30 covered with conductive blocks 32 (see FIG. 5). This layer of heat insulator may be a polymer deposited by spin-coating (it may comprise, for example, 10 $\mu$ of polyimide). In this case, an annealing operation for one hour at 300°–400° C. is necessary to obtain the full imidization of the polyimide.

The electrical contacts on the blocks of the reading circuit then have to be made. Several methods are possible.

Using a laser beam with a wavelength of less than 500 nm, it is possible to pyrolyze the polyimide on an area of about 10 $\mu^2$, the pyrolysis being done on top of the blocks 32, as shown in FIG. 5 where the laser beam, focused by the lens 41, is shown under the reference 40. Thus, small conductive wires ($\sigma$=S.cm$^{-1}$) are created through the polyimide.

Figure 6:
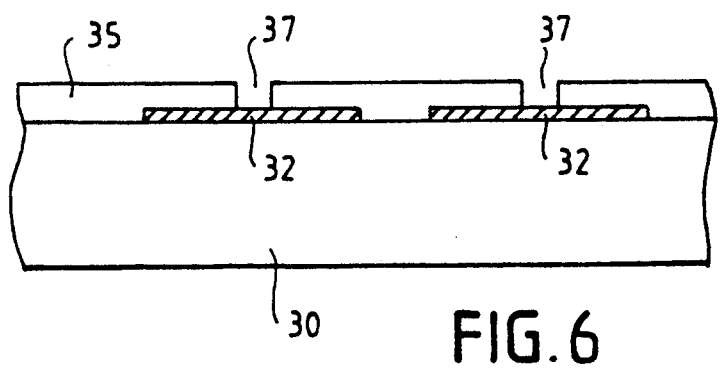
Figure 7:
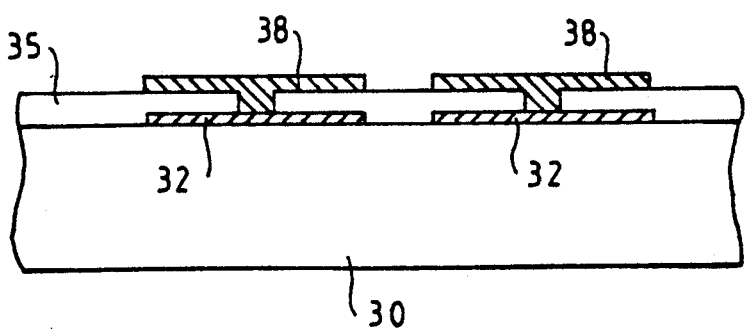

It is also possible, as shown in FIGS. 6 and 7, to carry out an ablation of material by laser to make small holes 37, for example by means of an excimer laser delivering a beam with a wavelength of less than 300 nm. It is then enough to make local depositions of metallizations 38 that correspond physically to the pixels to make contact with the conductive blocks 32 and have a replica of the set of electrodes present on the reading circuit. Yet other known methods may be used to etch the polyimide.

The substrate is then ready to receive the layer of pyroelectric material according to the method developed in the description of the first exemplary method of fabrication.

RESULTS OBTAINED

A pyroelectric polymer formed by PVDF-TrFE (75/25) has a pyroelectric coefficient $p_\gamma$ of $5.10^{-9}$ $C/cm^2 \cdot K$, a coefficient K of 0.0013 W/cm·K and a relative dielectric constant $\epsilon = 7$. For a structure according to the invention having a pixel area of 250 $\mu$ square, and for a pyroelectric layer thickness of 30 $\mu$, the NETD (Noise Equivalent Temperature Difference) coefficient is:

for the first exemplary method of fabrication: NETD $=0.5°$ K. for a rate of detection of 50 Hz and for a numerical aperture of the sighting objective $N=1$;

for the second exemplary method of fabrication: NETD$=0.3°$ K. using the same hypotheses as earlier.

What is claimed is:

1. An infrared detector based on pyroelectric material, of the type associated with a reading circuit prepared on a semiconductor substrate, said substrate also supporting conductive blocks designed to transmit the electrical signals generated by the pyroelectric material towards the reading circuit, each conductive block corresponding to a picture element or pixel, wherein the detector is formed by a layer of pyroelectric material deposited on that side of the semiconductor layer having the conductive blocks, the pyroelectric material having a thermal conductivity of $K<1$ W/m·°K., a counter-electrode covering said layer of pyroelectric material on the side opposite the conductive blocks.

2. An infrared detector according to claim 1, wherein the conductive blocks are arranged so as to form a matrix arrangement.

3. An infrared detector according to claim 1, wherein the pyroelectric- material is a polymer.

4. An infrared detector according to claim 3, wherein said polymer is selected from the group consisting of polyvinylidene fluoride, polyvinylidene fluoride trifluoroethylene, polyvinylidene cyanide vinylacetate, or polyvinylidene cyanide - vinylidene fluoride.

5. An infrared detector according to claim 1, wherein the pyroelectric material is a composite material formed by pyroelectric mineral fillers with high thermal conductivity mixed in a polymer matrix with low thermal conductivity.

6. An infrared detector according to claim 5, wherein the composite material consists of 60% by weight of lead zirconate mixed with polyimide.

7. An infrared detector based on pyroelectric material, of the type associated with a reading circuit prepared o a semiconductor substrate, said substrate also supporting conductive blocks designed to transmit electrical signals generated by the pyroelectric material towards the reading circuit, each conductive block corresponding to a picture element or pixel, wherein the detector is formed by a layer of pyroelectric material and is associated with a layer of heat insulator placed between the semiconductor substrate and the layer of pyroelectric material and is deposited on that side of the semiconductor layer having the conductive blocks, electrical conduction means being placed between the conductive blocks and the face of the layer of pyroelectric material adjacent to the layer of heat insulator and through this layer of heat insulator, the pyroelectric material having a thermal conductivity of $K<1$ W/m·°K., a counter-electrode covering said layer of pyroelectric material on the side opposite the conductive blocks.

8. An infrared detector according to any one of claims 1 through 7 wherein an infrared absorbent layer is deposited on the counter-electrode.

9. An infrared detector comprising:
a semiconductor substrate;
a plurality of conductive blocks formed on a first surface of said semiconductor substrate;
a heat insulator layer formed on said conductive blocks and said first surface of said semiconductor substrate;
a layer of pyroelectric material formed on said heat insulator layer;
electrical conduction means formed between the conductive blocks and the layer of pyroelectric material through the heat insulator layer;
wherein each conductive block transmits electrical signals generated by the pyroelectric material and corresponds to a picture element or pixel;
wherein the pyroelectric material has a thermal conductivity of $K<1$ W/m·°K.; and
a counter-electrode formed on said layer of pyroelectric material.

10. An infrared detector according to claim 9, wherein the conductive blocks are arranged so as to form a matrix arrangement.

11. An infrared detector according to claim 9, wherein the pyroelectric material is a polymer.

12. An infrared detector according to claim 1, wherein said polymer is selected from the group consisting of polyvinylidene fluoride, polyvinylidene fluoride trifluoroethylene, polyvinylidene cyanide vinylacetate, or polyvinylidene cyanide - vinylidene fluoride.

13. An infrared detector according to claim 9, wherein the pyroelectric material is a composite material formed by pyroelectric mineral fillers with high thermal conductivity mixed in a polymer matrix with low thermal conductivity.

14. An infrared detector according to claim 13, wherein the composite material consists of 60% by weight of lead zirconate mixed with polyamide.

15. An infrared detector according to any one of claims 9 to 14, wherein an infrared absorbent layer is deposited on the counter-electrode.

* * * * *